US005325330A

United States Patent [19]
Morgan

[11] Patent Number: 5,325,330
[45] Date of Patent: Jun. 28, 1994

[54] MEMORY CIRCUIT WITH FORESHORTENED DATA OUTPUT SIGNAL

[75] Inventor: Donald M. Morgan, Boise, Id.

[73] Assignee: Micron Semiconductor, Inc., Boise, Id.

[21] Appl. No.: 17,095

[22] Filed: Feb. 11, 1993

[51] Int. Cl.$^5$ .............................................. G11C 7/00
[52] U.S. Cl. ..................... 365/189.050; 365/189.310; 365/203; 365/230.010
[58] Field of Search ........... 365/189.05, 233.5, 230.08, 365/230.06, 189.01, 205, 189.11, 203

[56] References Cited

U.S. PATENT DOCUMENTS

| | | | |
|---|---|---|---|
| 4,649,522 | 3/1987 | Kirsch | 365/189 |
| 4,849,935 | 7/1989 | Miyazawa | 365/189.05 |
| 4,894,803 | 1/1990 | Azaki | 365/189.11 |
| 4,953,130 | 8/1990 | Houston | 365/203 |
| 5,027,326 | 6/1991 | Jones | 365/221 |
| 5,088,065 | 2/1992 | Hanamura | 365/202 |
| 5,245,573 | 9/1993 | Nakaoka | 365/189.05 |

*Primary Examiner*—Eugene R. LaRoche
*Assistant Examiner*—Tan Nguyen
*Attorney, Agent, or Firm*—William R. Bachand

[57] ABSTRACT

A memory device output buffer circuit provides an output data signal only when data is valid. According to the present invention, the circuit for a memory read function provides a pair of signals equilibrated prior to each read operation. Data is valid when the signals are complementary. For a tristate output, the complementary condition enables the output buffer. In a semiconductor dynamic random access memory (DRAM) connectable to a bidirectional data bus, the three-state output buffer of the present invention is not enabled during a read operation until data is valid. Spurious output data signals are prevented from consuming power. As an additional benefit, the bus is not dedicated to the memory when valid data is not yet available.

20 Claims, 9 Drawing Sheets

MEMORY CIRCUIT WITH FORESHORTENED DATA OUTPUT SIGNAL

FIELD OF THE INVENTION

The invention relates to semiconductor memory devices. Particularly, the invention relates to circuits for reading data from semiconductor memory devices.

BACKGROUND OF THE INVENTION

The unit of information for storage and retrieval in digital systems is the data bit, a binary number having a value of zero or one. A data bit in a digital system has logic states of "high" and "low," often corresponding to a physical parameter such as the voltage at a node in a circuit. Information stored in semiconductor circuits is quantified in terms of the number of bits stored. These circuits, collectively called memory devices, include latches, flip-flops, registers, and memories depending to some extent on the number of bits stored. However, the fundamental circuit for storing a data bit, herein called a memory cell, is the common building block from which latches, flip-flops, registers, memories, and the like are made.

Several common circuits have been used for the memory cell in the various types of memory devices. Some devices including the dynamic random access memory (DRAM) employ a memory cell circuit having primarily one transistor. The DRAM cell provides one signal for stored data. Other devices including the static random access memory (SRAM) employ a memory cell circuit having primarily a cross coupled pair of transistors. The SRAM cell provides two complementary signals for stored data. For example, when the signals are respectively D and D*, a zero is represented when D is low and D* is high, a one is represented when D is high and D* is low. Other combinations of D and D* are undefined, that is they serve no purpose in the memory device.

Memory devices that are used for storing many bits of information provide an output data signal in response to an input address signal during a "read" operation called a read cycle. In a complex memory device the read operation may be performed as a process of selecting, sensing, and outputting the content of memory cells. The duration of such a process is called the access time. Complex memory devices may have several types of operations distinguished by control signals including read/write, address strobes, programming and erasure strobes, transfer enable, and output enable signals. The read cycle begins when the operation is defined by these control signals and an address is specified on the address input of the memory device.

The address can be specified in one of several ways depending on the design of the memory device. For example, an address can be specified in serial in conjunction with a clock signal or in parallel often accompanied by a strobe signal. A combination of these methods could be used, for example, by presenting on 16 parallel address lines a 32-bit address in two steps accompanied by upper and lower address strobes. In a conventional DRAM these strobes are associated with the row and column organization of memory cells in an array. Designs for high density memory devices employ several arrays of cells having minute dimensions. Typically, the signal or signals representing the data bit in a memory cell in such an array are weak.

The read cycle concludes with presentation of signals for use outside the memory device that represent the data addressed. The weak signal levels internal to the memory device are sensed and amplified. Amplified signals at internal signal levels are then translated to conventional logic levels and gated onto the output terminals of the memory device. The level translation and gating are accomplished by an output buffer circuit. When the output buffer is supplying a signal on the output terminal, it is said to be gated on, or enabled; otherwise it is off or disabled. One aspect of the present invention solves a timing problem associated with the interaction of the sensing circuit and the output buffer circuit.

Memory circuit timing is critical to the efficiency of many systems applications for memory devices. In a computer system, for example, the processor and memory devices are connected by a signal path called a bus. The bus is used for information flow to the processor and from the processor to other devices on the bus. One measure of system efficiency is the extent of time the bus is idle or unusable. The bus is idle when it is not being used by any device. The bus is unusable when it is dedicated to a device but the signal on the bus is invalid, conveying no useful information.

Conventional DRAM devices used in computer systems allow the output buffer to provide spurious signals on the bus causing the bus to be unusable for a period of time. This problem is described in terms of DRAM devices in a computer system but exists in other applications and with other types of memory devices. For the DRAM application, the bus is unusable for a time preceding output of valid data. A read cycle begins when the row address strobe (RAS*) falls (a high to low transition) at a time when the address input specifies the row address. When the column address is specified on the address input, the column address strobe (CAS*) falls. Conventionally, the output buffer is enabled a delay after CAS* falls and before data can be guaranteed to be valid. Hence, spurious signals can appear on the bus, and consequently other uses of the system bus must wait until the memory device is no longer dedicated to the bus; and, power is wasted while driving spurious signals to conventional logic levels.

In other conventional memory devices including DRAM and video random access memory (VRAM) devices, read operations include a so-called page mode having an access time. In page mode, a row address is specified for use with several subsequently specified column addresses. Column address changes are detected by a circuit that provides a timing pulse. The timing pulse enables the output buffer after a fixed predetermined delay. The delay may be too short for some memory cells and sense amplifiers that respond relatively slowly due to physical location or circuit element variations caused by fabrication process variations. In such a case the output buffer is enabled (upon the expiration of the delay) at a time when spurious signals exist on the data path. If the delay is long enough to avoid all spurious signals, data from faster cells will wait at the output buffer before the buffer is enabled. A faster access time would have been possible had the delay been shorter.

Some conventional memory devices perform back to back read operations. In such a device a subsequent read cycle immediately follows latching previously read data in the output buffer. A timing pulse operates the latch after a fixed predetermined delay. In some devices, column address changes are detected by a circuit that provides the timing pulse. The delay must be designed to allow for the precharge, address decoding, sensing, and driving required for the longest read operation in order to guarantee that the latched data represents the content of the memory and not spurious signals preceding the memory content signal. When the delay is long enough to avoid all spurious signals, data from faster cells will wait at the output buffer before the latch is enabled. A faster access time would have been possible had the delay been shorter.

DRAM or VRAM devices designed to enable the output buffer after a fixed predetermined delay cannot be effectively sorted by access time. When many devices are manufactured on a single wafer, the predetermined delay must be long enough to account for process variation. For example, if the delay is long enough to guarantee operation of all devices on the wafer, the performance of some of the devices is limited by the delay. These devices could have been sorted and guaranteed at a faster access time than the access time of other devices on the same wafer. Memory devices guaranteed at a faster access time command a higher market price and facilitate new and improved systems from integrated microprocessors to automated equipment.

Thus, there remains a need for a memory device whose output buffers do not output spurious signals. In addition, there remains a need for an improved method for reading a memory cell without dependence on predetermined delays. Further improvement in performance of systems using memory devices can be gained by employing methods of the present invention and incorporating circuits of the present invention in the design of memory devices.

SUMMARY OF THE INVENTION

A memory device according to the present invention includes a circuit for enabling the output buffer. The circuit enables the output buffer when data is valid. In an alternate embodiment, a circuit of the present invention includes a latch in the output buffer and means for enabling the latch when data is valid. The validity of data is determined from a pair of binary logic signals that represent the content of a memory cell selected for a read operation. The pair of signals can represent four states. Two of the states signify, respectively, a valid '1' and a valid '0' read from the memory cell. At least one of the other remaining states signifies that data is not valid. To enable the output buffer or latch as soon as data is valid and not before, the circuit detects the transition between a state where data is not valid and either of the two states where data is valid.

According to an aspect of the present invention, memory devices of the same design can be speed graded. Since access time from a particular memory device of the present invention is not dependent on a predetermined delay, devices that produce valid data faster than other devices of the same design can be guaranteed to operate in systems demanding higher access speed.

According to another aspect of the present invention, the output buffer of a memory device is enabled only when the output signal will validly represent the content of an addressed memory cell.

According to another aspect of the present invention, an output latch of a memory device is enabled when the output signal will validly represent the content of an addressed memory cell.

According to another aspect of the present invention, a system bus is shared more efficiently among memory devices and other devices in a system application. Such other devices can control the bus for longer periods of time before a memory device uses the bus for valid data output.

According to another aspect of the present invention, spurious transitions on the output of a memory device are eliminated to improve system noise immunity.

According to yet another aspect of the present invention, spurious transitions on the output terminal of a memory device are eliminated to reduce power consumption of memory devices and systems employing memory devices.

These and other aspects, advantages, and features of the present invention will become apparent by reference to the following description of the invention in conjunction with the referenced drawing figures.

In each functional block diagram, a broad arrow symbolically represents a group of signals that together signify a binary code. For example, a group of address lines is represented by a broad arrow because a binary address is signified by the signals taken together at an instant in time. A group of signals having no binary coded relationship is shown as a single line with an arrow. A single line between functional blocks represents one or more control signals.

Signals that appear on several Figures and have the same mnemonic are directly or indirectly coupled together. A signal named with a mnemonic and a second signal named with the same mnemonic followed by an asterisk are related by logic inversion.

In each timing diagram the vertical axis represents binary logic levels and the horizontal axis represents time. Neither axis is drawn to scale. The vertical axis is intended to show the transition from active (asserted) to passive (nonasserted) states of each logic signal. The voltage levels corresponding to the logic states of the various signals are not necessarily identical among the various signals.

DETAILED DESCRIPTION OF THE INVENTION

Figure 1:
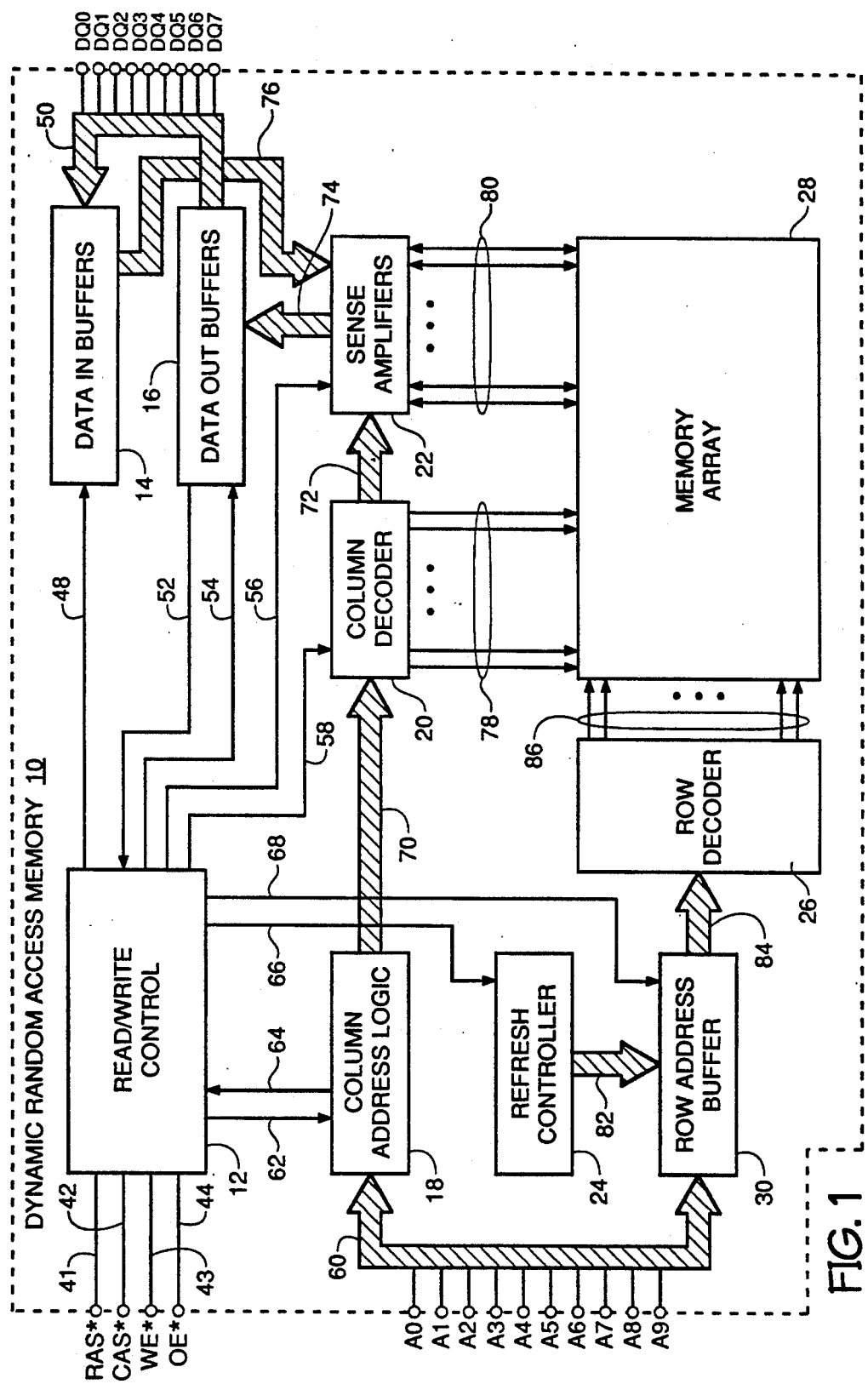
FIG. 1 is a functional block diagram of a dynamic random access memory device of the present invention.

FIG. 1 is a functional block diagram of a dynamic random access memory device 10 of the present invention. Memory device 10 is controlled by binary control signals 41-44 input to read/write control 12. Control signals 41-44 are conventionally known by names corresponding to the primary function of each signal. Signal 41 is row address strobe (RAS*). Signal 42 is column address strobe (CAS*). Signal 43 is write enable (WE*). Signal 44 is output enable (OE*). When RAS* falls, the state of address bus 60 is latched in row address buffer 30 in response to control signals 68. When CAS* falls, the state of address bus 60 is latched in column address logic 18 in response to control signals 62. Read/write control 12 also responds to changes in the column address as indicated by address change signals 64 for improved read access time as in page mode.

Several read and write modes of operation are conducted by read/write control 12 in response to combinations of control signals 41-44 and address change signals 64. Refresh mode is one such operation conducted in cooperation with refresh controller 24. In contrast to read and write operations, refresh does not normally require signals on address bus 60 or data bus 50.

A single memory cell of memory array 28 is selected for read and write operations according to the intersection of a decoded row signal and a decoded column signal. Binary row address bus 84 is coupled to row decoder 26. Row decoder 26 asserts a row select signal on one or more row activating signals 86. Column address logic 18 presents binary column address bus 70 to column decoder 20. Column decoder 20 asserts a column select signal on one or more of the column activating signals 78. A portion of the binary column address is also coupled to sense amplifiers 22 to support further decoding as may be required. If row decoder 26 and column decoder 20 provide signals that activate more than one memory cell from memory array 28, further selection is accomplished by decoding circuits functionally included in sense amplifiers 22. Hence, memory array 28 can be implemented as a single row-column array or can be implemented in more than one row-column array. As shown in FIG. 1, memory array 28 includes one or more arrays such that 8 cells, one cell for each DQ line in data bus 50, are selected by the intersection of a decoded row signal and a decoded column signal.

Sense amplifiers 22 functionally includes circuitry that may be spatially distributed integral to memory array 28, or external to memory array 28, or both. Memory array 28 is coupled to sense amplifiers 22 by a group of input/output (I/O) signals 80. I/O signals 80 may be activated one per selected cell or one pair per selected cell depending on the design of the memory cell in memory array 28.

Sense amplifiers 22 perform several functions responsive to control signals 56. When cell contents are to be overwritten in a write operation, driver circuits in sense amplifiers 22 establish proper cell contents in response to write data signals 76 from data in buffers 14. In read operations cell contents are amplified and presented to data out buffers 16 on global I/O (GIO) signals 74.

Data out buffers 16 are instrumental for read operations. Data out buffers 16 drive data bus 50 which comprises several individual data lines shown as DQn. Alternate memory devices may have less or more DQ lines and may have separate lines for the data in (D) function and the data out (Q) function. As shown, memory device 10 has eight DQ lines, each of which is bidirectional. Each bidirectional line is driven by a three state circuit in data out buffers 16. The output of a three state circuit represents a logic low, a logic high, or an off state. In the off state, the three state circuit provides a high impedance to the DQ line so that drive circuits external to memory device 10 can drive a signal onto the DQ line for data in buffer 14 without contention.

Improved read operation is made possible in the present invention by the cooperation of sense amplifiers 22, data out buffers 16 and read/write control 12. Data out buffers 16 present status signals 52 to read/write control 12. In response to current and anticipated modes of operation indicated by control signals 41-44 and address change signals 64, read/write control 12 provides control signals 54 to data out buffers 16. In the present invention, global I/O signals 74 signify three conditions for each DQ line: (a) the content of a selected memory cell is a '0' ready to be driven to a DQ line, (b) the content of a selected memory cell is a '1' ready to be driven to a DQ line, and (c) the DQ line should be kept in the off state because the read operation is not yet complete. We now turn to describe data out buffers 16 in more detail.

Figure 2:
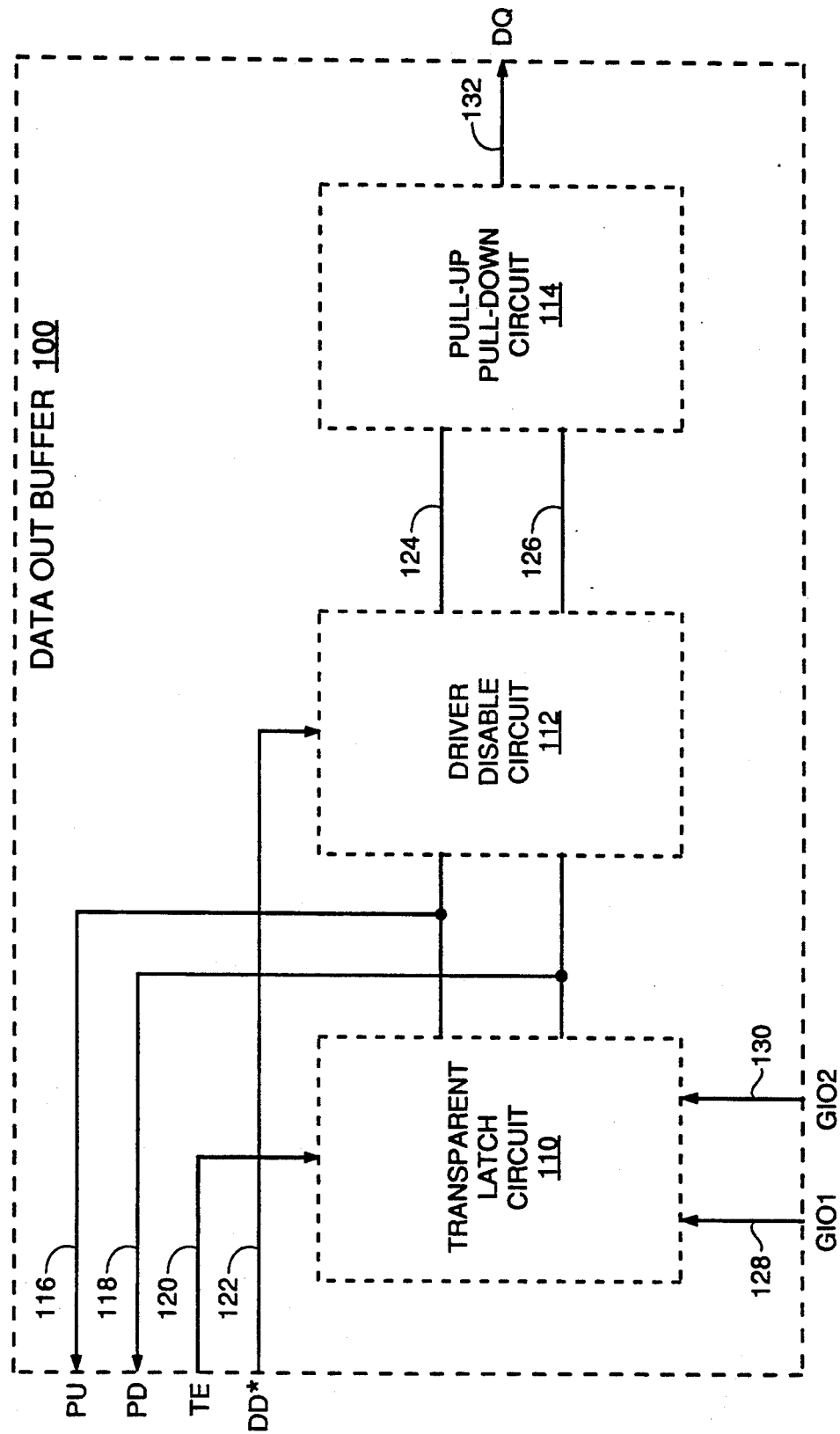
FIG. 2 is a functional block diagram of a data out buffer of the memory device shown in FIG. 1.

FIG. 2 is a functional block diagram of a data out buffer 100. Data out buffer 100 is part of data out buffers 16 of memory device 10 shown in FIG. 1. For a memory device having several DQ lines, a data out buffer as shown in FIG. 2 is coupled to each DQ line. The content of a memory cell as represented by signals 128 and 130 is coupled to a DQ line 132 of memory device 10 through transparent latch circuit 110, driver disable circuit 112, and pull-up and pull-down circuit 114.

Data out buffer 100 is capable of three-state operation. When the signals on lines 124 and 126 are low, pull-up and pull-down circuit 114 presents a high impedance on DQ line 132. When the signal on line 124 is high and on line 126 is low, DQ is driven high representing the '1' content of a memory cell. Conversely, when the signal on line 124 is low and the signal on line 126 is high, DQ is driven low representing the '0' content of a memory cell. The DQ line will enter the high impedance state when driver disable (DD*) signal on line 122 is asserted (active low). Signal DD* responds in part to output enable (OE*) signal 44 shown on FIG. 1.

The DQ line will also enter the high impedance state when transparent latch enable (TE) signal is asserted on line 120 and global I/O (GIO) signals on lines 128 and 130 signify the read operation is not yet complete as already discussed. After signal TE transitions from being asserted, pull-up (PU) signal on line 116 and pull-down (PD) signal on line 118 correspond to the state of GIO1 and GIO2 before the transition and further changes in the state of GIO1 and GIO2 have no further effect on signals PU and PD. By isolating signals GIO1 and GIO2 from signal DQ, column decoding and sensing related to a subsequent read operation can be accomplished while data from the current read operation is held for output on signal DQ. Signals GIO1 and GIO2 are represented on FIG. 1 by signals 74.

Figure 3:
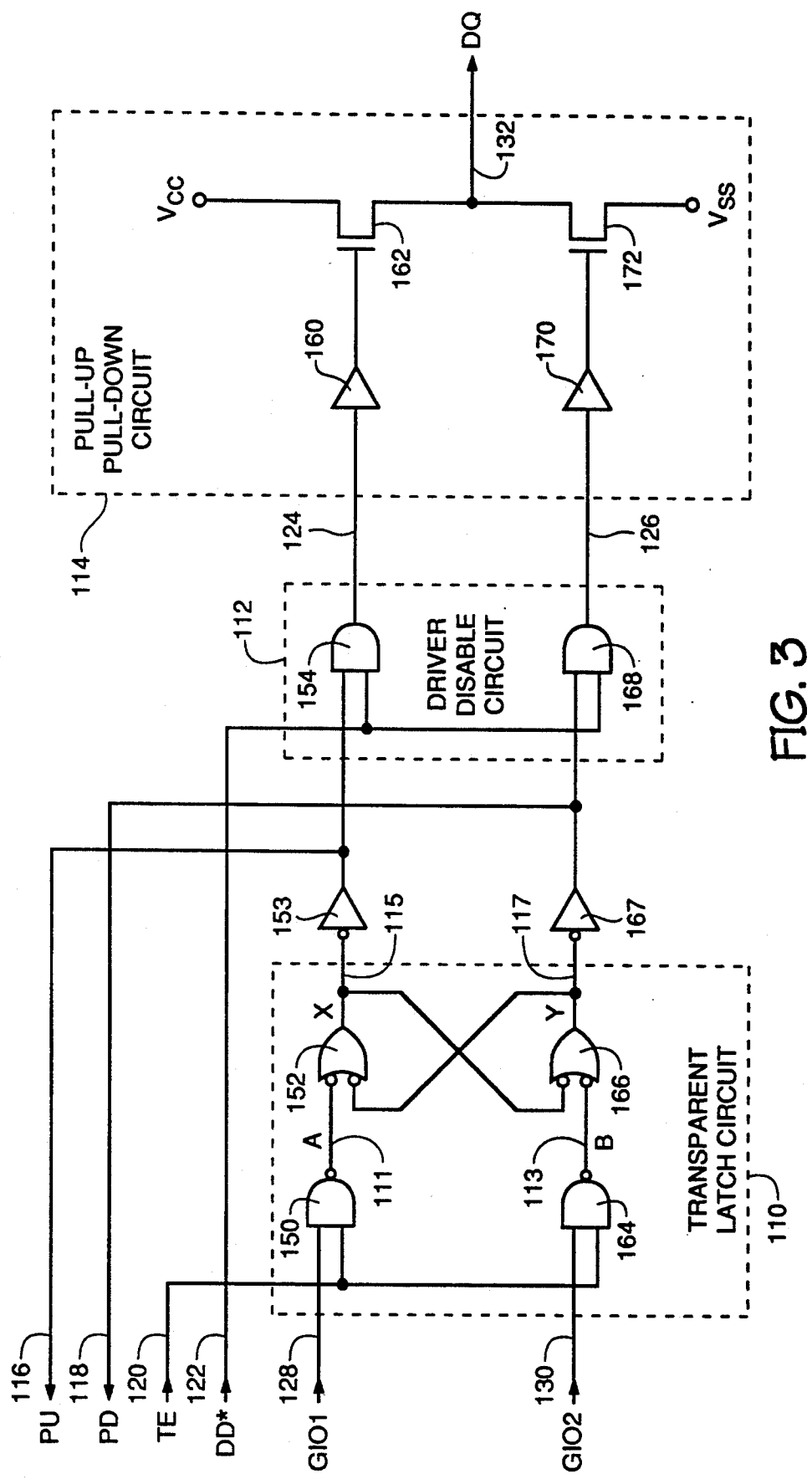
FIG. 3 is a schematic diagram of one embodiment of a data out buffer.

FIG. 3 is a schematic diagram of one embodiment of data out buffer 100 shown in FIG. 2. Signals, lines, and functional blocks corresponding to the data out buffer shown in FIG. 2 bear the same number designations in FIG. 3.

When transparent latch enable (TE) signal on line 120 is high and driver disable (DD*) signal on line 122 is high, the transparent latch and driver disable circuits allow propagation of a high-to-low transition on either global I/O line 128 or 130 to bring the DQ line 132 out of the high impedance state. Table 1 describes the operation of transparent latch 110. Pull-up (PU) and pull-down (PD) signals on lines 116 and 118 correspond to the latched prior state of GIO1 and GIO2 when TE is low and correspond to the current state of signals GIO1 and GIO2 when TE is high. Prior to valid data on signals GIO1 and GIO2, signals PU and PD will both be low. When signal DD* is low, gates 154 and 168 force signals on lines 124 and 126 low. When signals on lines 124 and 126 are both low, FETs 162, 172 are off and the DQ line is in a high impedance state. When DD* is high, signal PD, when high, activates buffer 170, turns on FET 172, and drives the DQ line low. When DD* is high, signal PU, when high, activates buffer 160, turns on FET 162, and drives the DQ line high.

TABLE 1

| A | B | X | Y |
|---|---|---|---|
| 0 | 0 | 1 | 1 |
| 0 | 1 | 1 | 0 |
| 1 | 0 | 0 | 1 |
| 1 | 1 | Prior State | Prior Sate |

When signal DD* is high and signals TE, GIO1, and GIO2 are high, the DQ line will be in the high impedance state because the outputs of gates 150 and 164 are forced low and signals on lines 124 and 126 are then both low. When signals DD* and TE are held high, the DQ line comes out of high impedance state as soon as the read operation is complete, i.e. as soon as the GIO1 and GIO2 signals signify valid content of a memory cell. The data path from a memory cell to the GIO1 and GIO2 signals will now be described in greater depth.

Figure 4:
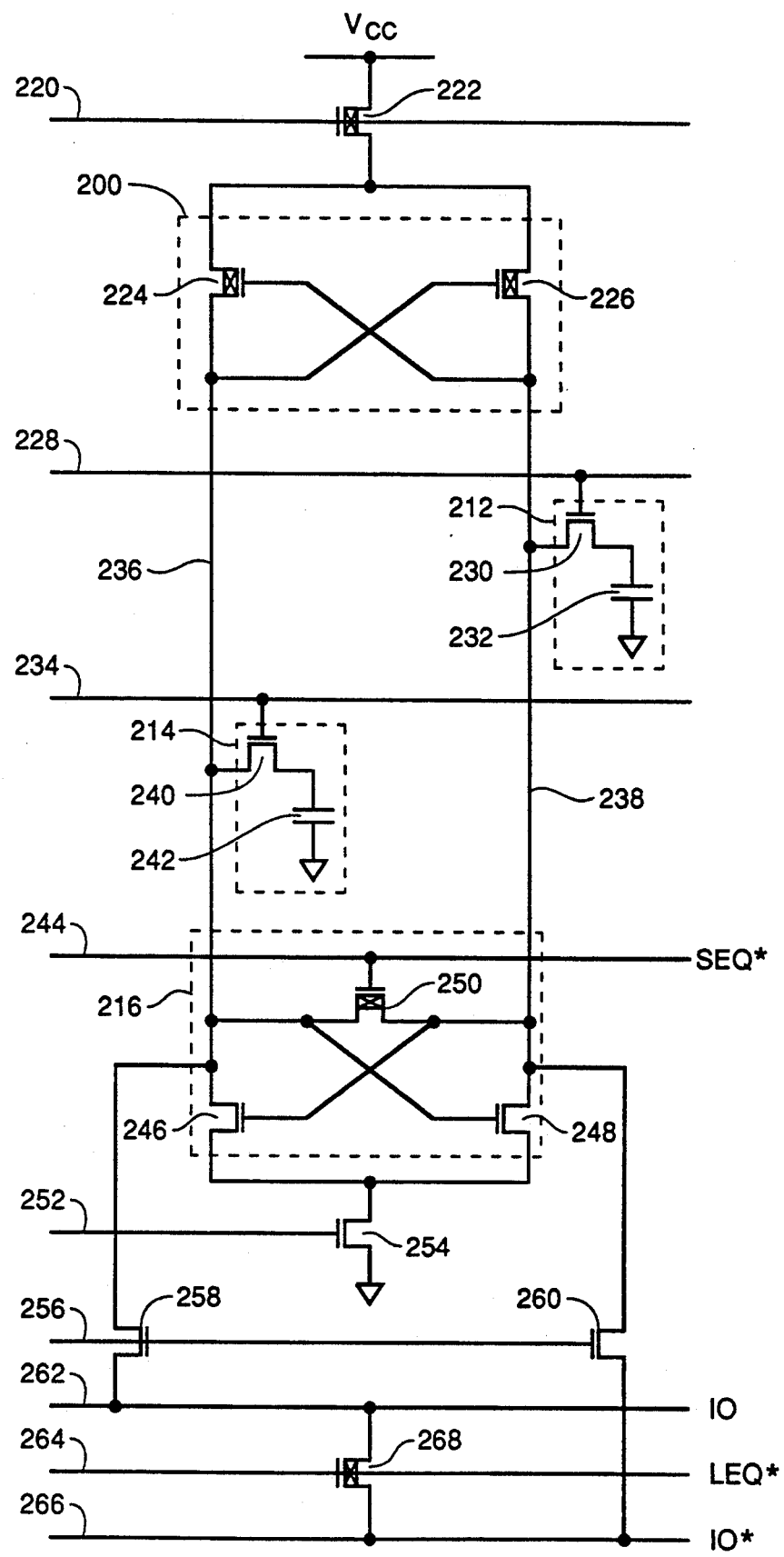
FIG. 4 is a schematic diagram of a portion of the memory array and sense amplifiers of the memory device shown in FIG. 1.

FIG. 4 is a schematic diagram of a portion of the memory array and sense amplifiers of the memory device shown in FIG. 1. For clarity, the schematic diagram is simplified and shows the intersection of a single column and two rows. In a practical DRAM many rows would intersect a single column and each row would connect to many memory cells. Memory cell 212 is part of a first row and stores charge representing inverted data for a first data bit. Memory cell 214 is part of a second row and stores charge representing noninverted data for a second data bit. During a read operation, only one row is enabled to charge line 236 or line 238. The difference between the charged line and the uncharged line is sensed and amplified by N-sense amplifier 216 and P-sense amplifier 200.

Prior to a read operation, lines 236 and 238 are equilibrated through transistor 250 in response to an active low signal SEQ* on line 244. IO lines 262 and 266 are also equilibrated through transistor 268 in response to an active low signal LEQ* on line 264.

When a row is selected, a row line such as line 234 is asserted high. FET 240 then conducts the charge, if any, stored on capacitor 242 onto digit line 236. After a time sufficient for charge to be transferred, N-sense amplifier 216 and P-sense amplifier 200 are enabled by applying power and ground potentials through transistors 222 and 254. Soon thereafter, bi-stable sense amplifiers 200 and 216 will reach a stable state wherein digit line 236 and digit* line 238 will separate, i.e. these lines are driven from an equilibrated state to separate internal logic levels. When a column is selected, a column select line such as line 256 is asserted high. In response, FETs 258 and 260 are turned on and couple digit line 236 and digit* line 238 onto IO lines 262 and 266. IO lines 262 and 266 then separate. The signal on IO lines 262 and 266 at the end of a read operation represents data stored at a particular row-column address.

In a practical DRAM many columns are arranged to couple to a single pair of IO lines and several pairs of IO lines may be activated simultaneously responsive to a portion of the column address. The remaining portion of the column address is used to select a single pair of IO lines, herein called global IO lines, that couple to a data output buffer. In the typical DRAM, only one pair of IO lines is coupled to each data out buffer for a read operation.

Figure 5:
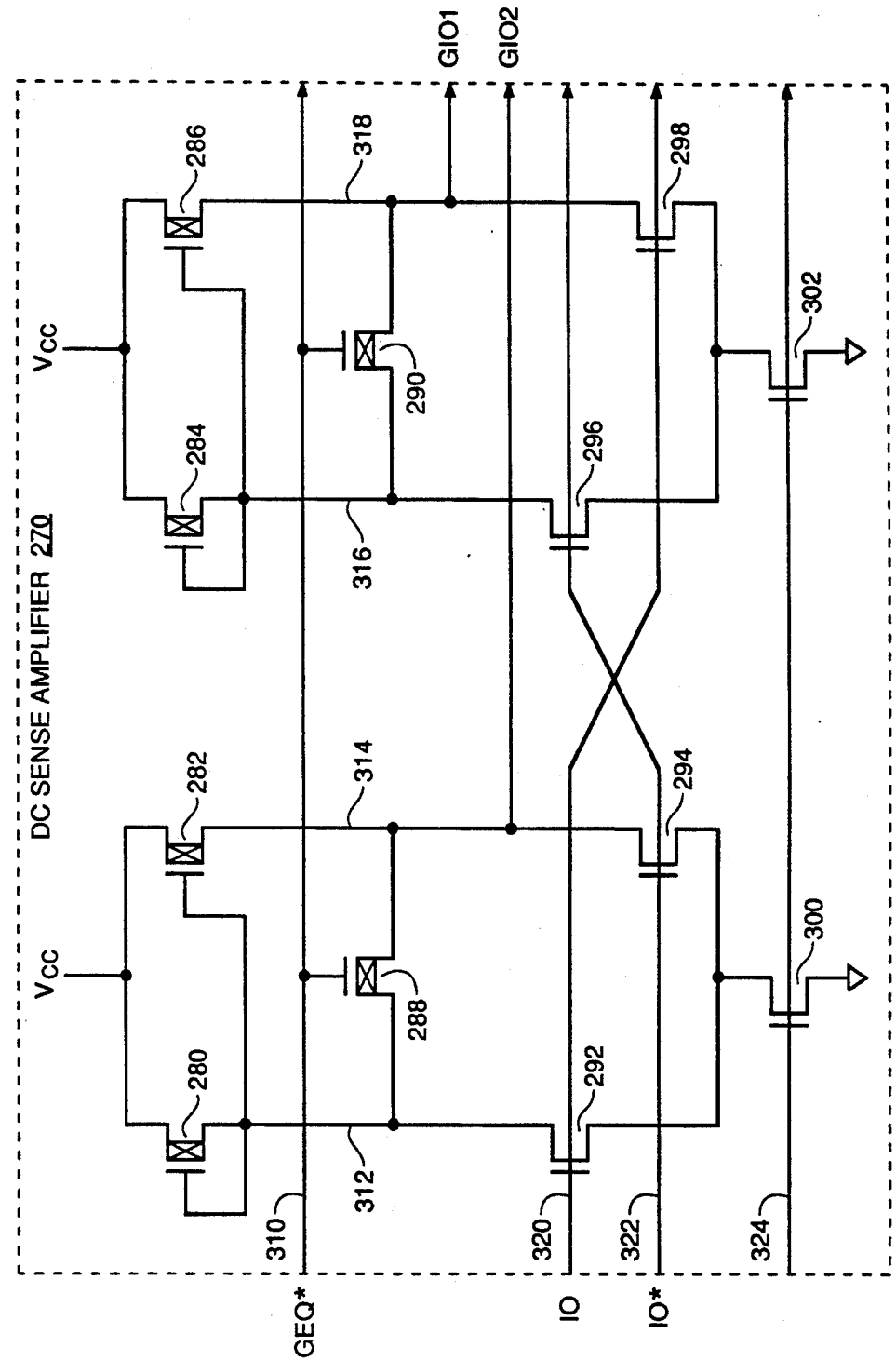
FIG. 5 is a schematic diagram of a DC sense amplifier included in the sense amplifiers of the memory device shown in FIG. 1.
Figure 9:
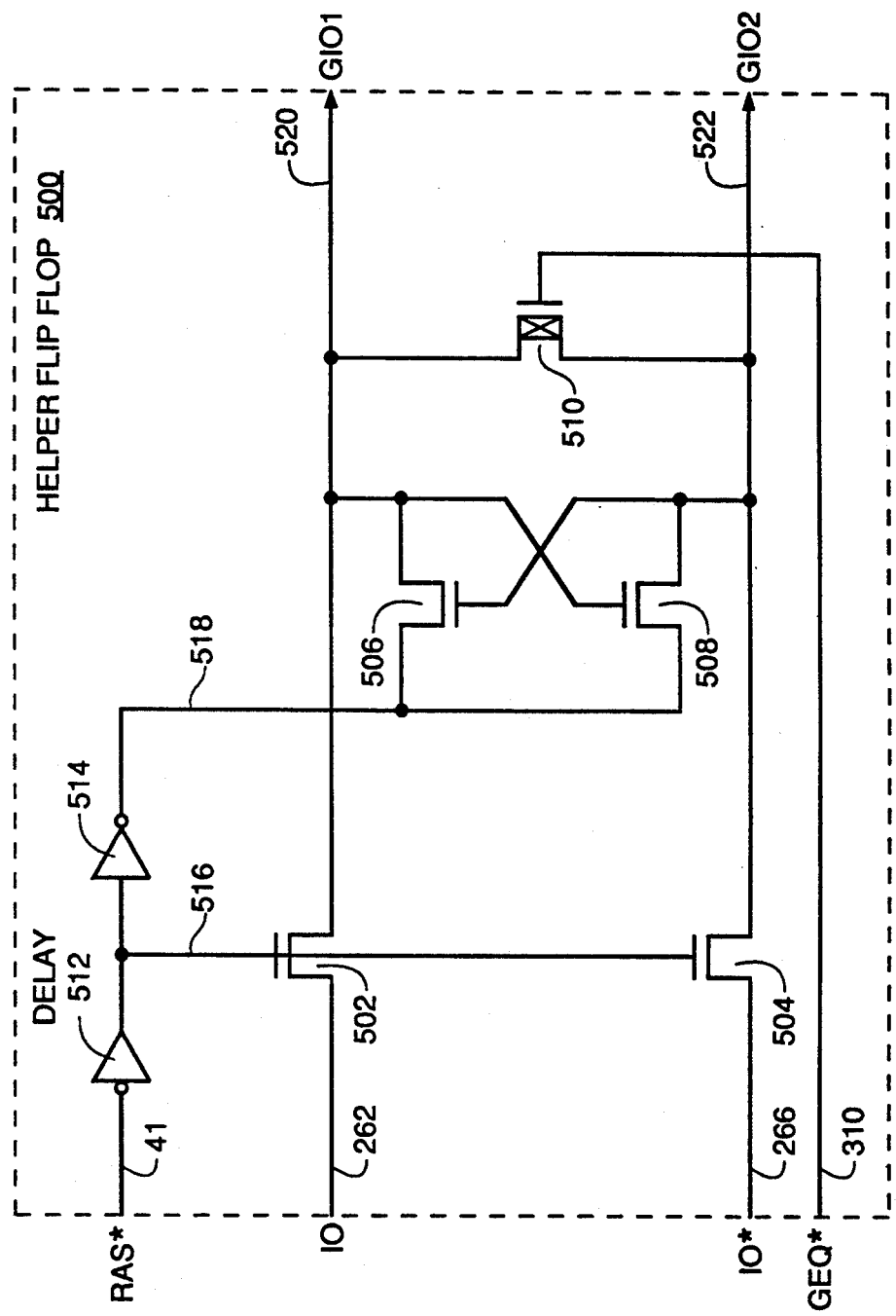
FIG. 9 is a schematic diagram of a helper flip flop included in an alternate embodiment of the sense amplifiers of the memory device shown in FIG. 1.

Prior to coupling to the data output buffer, the signals on the IO lines are amplified. Two circuits for such amplification will be discussed. The first is called a DC sense amplifier and is similar to an analog differential amplifier (FIG. 5). The second is a bistable circuit called a helper flip flop (FIG. 9).

FIG. 5 is a schematic diagram of DC sense amplifier 270 included in the sense amplifiers of the memory device shown in FIG. 1. Signal 324 activates DC sense amplifier 270 by connecting a ground potential through transistors 300 and 302. Amplifier 270 is, thus, enabled prior to the beginning of a read operation. At a time before IO lines 262 and 266 (shown in FIG. 4) separate, global equilibration signal 310 equilibrates lines 312 and 314 through transistor 288 and equilibrates lines 316 and 318 through transistor 290.

After equilibration, lines 318 and 314 (signals GIO1 and GIO2) have an identical voltage designed to be above the threshold of an internal logic '1' level. The voltage on line 318, for example, is determined as a voltage divider dependent on the magnitude of VCC, the voltage drop across FET 286, and the voltage drop across FETs 298 and 302. The internal logic '1' level is selected to be higher than a predetermined threshold voltage. Likewise, the logic '0' level is selected to be lower than the predetermined threshold voltage. The threshold voltage characteristic is implemented in switching circuits coupled to the GIO1 and GIO2 signals on lines 318 and 314, respectively. See, for example, gates 150 and 164 shown on FIG. 3.

During the read operation, the signals appearing on IO lines 262 and 266 shown on FIG. 4 are coupled to IO lines 320 and 322, perhaps through additional selection circuits. As IO lines 320 and 322 separate, global IO signals (GIO1 and GIO2) on lines 318 and 314 are driven to opposite internal logic levels through cooperation of loads 282 and 286 and FETs 294 and 298. Thus, GIO1 and GIO2 separate immediately after IO lines 320 and 322 separate.

By coupling GIO signals 318 and 314 to GIO inputs 128 and 130 of a data output buffer shown in FIGS. 2 or 3, the content of a memory cell is represented by a signal coupled to a DQ line. Having described the data path for one embodiment, we now turn to a description of the method for controlling the data output buffer and related circuits of the present invention.

Figure 6:
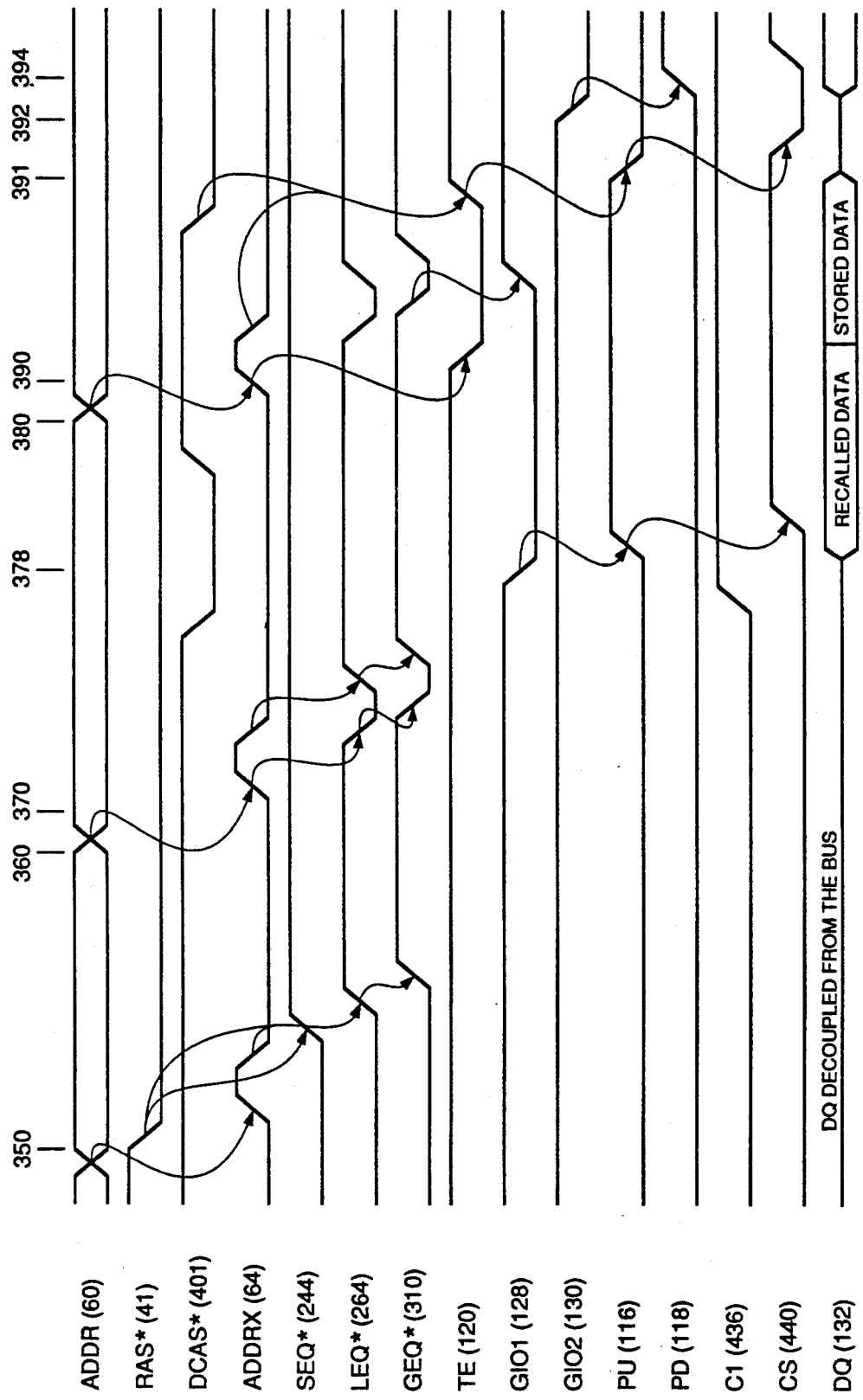
FIG. 6 is a timing diagram describing a method of controlling the sense amplifier and output buffer circuits shown in FIGS. 3, 4, and 5.

FIG. 6 is a timing diagram describing a method of controlling the sense amplifier and output buffer circuits shown in FIGS. 4, 5, and 3. The diagram depicts the initial portion of a read cycle characterized by write enable (WE*) signal 43 high. The address of the memory cell to be read is presented on address bus 60 as a row address at time 350 and a column address at times 370 and 390. Transparent latch enable (TE) signal 120, initially high to enable circuit 110, is taken low at a critical time as will be described below.

Data is read from the addressed cell as follows. Row address strobe (RAS*) signal 41 falls when the row address is presented. Equilibration signals 244, 264, and 310 which had been active in anticipation of the read cycle are removed in response to RAS* and ADDRX. Address change pulse (ADDRX) signal 64 is responsive to changes in the binary address on bus 60. ADDRX is asserted for a short time after each change of the binary state of column address A signal related to column address strobe (CAS*) signal 42 is shown as delayed column address strobe (DCAS*) signal 401. DCAS* falls at time 370 when the first column address is presented. Equilibration signals 264 and 310 are pulsed in response to ADDRX. At time 378 data from the addressed memory cell is coupled to global IO lines 128 and 130 and they separate. With TE high, the falling edge of GIO1 propagates through circuit 110. Signal PU then goes high in response to GIO1. In response to PU high and PD remaining low, the DQ line 132 is driven high to represent a '1' read from the addressed cell. The TE signal remains high during the first read cycle from time 350 to time 380.

During the first read cycle from time 370 to 390, transitions on signal TE are not required. Signals C1 and CS have states that distinguish the first cycle from subsequent cycles. Signal 436 (C1) goes high in response to the first falling edge of DCAS* after RAS* goes low. Signal 440 (CS) goes high in response to separation of GIO lines 128 and 130 during the first read cycle.

At time 390, a second column address is available on address bus 60 for a page mode read operation. Signal TE falls in response to the rising edge of ADDRX. When TE is low, transparent latch circuit 110 holds data from the prior read operation and new data present on GIO1 and GIO2 has no effect on signals PU and PD at the output of the latch. Signal TE remains low until the later of two events: (a) the falling edge of ADDRX which coincides with the end of equilibration and (b) the falling edge of DCAS* which coincides with the end of the so-called extended data out function. During the period for extended data out, equilibration signals 264 and 310 are pulsed in response to ADDRX.

After equilibration, signals GIO1 and GIO2 are both high. If DCAS* falls before GIO1 and GIO2 separate, as shown in FIG. 6, then TE, GIO1, and GIO2 are all high with the result that signals PU and PD are both low. Consequently, signal DQ on line 132 transitions from driving data from the prior read operation to an off condition. Spurious signals related to the subsequent read operation are not driven onto the bus.

The separation of signals GIO1 and GIO2 signify valid data has been read from memory. If separation of signals GIO1 and GIO2 follows the rising edge of TE as shown at times 392 and 391 respectively, then signals PU and PD are driven to levels representing valid data from the second read operation at time 394. If, on the other hand, signals GIO1 and GIO2 separate before time 391, then signals PU and PD respond as soon as signal TE goes high. In the latter case, signals PU, PD, and DQ transition from representing data from the prior read operation to representing data from the current read operation with no intervening off condition. In this way, signal DQ on line 132 represents the content of the addressed memory cell as soon as data read is valid.

The TE pulse shown between time 390 and 391 occurs in all subsequent page mode read cycles prior to the rising edge of RAS*. Delay and pulse shaping circuits, known to those of ordinary skill, may be necessary for some memory devices to assure that the falling and rising edges of the TE pulse occur at times that implement proper operation of transparent latch circuit 110. Selection of appropriate internal logic levels and input thresholds is also within the ordinary skill of the art.

Figure 7:
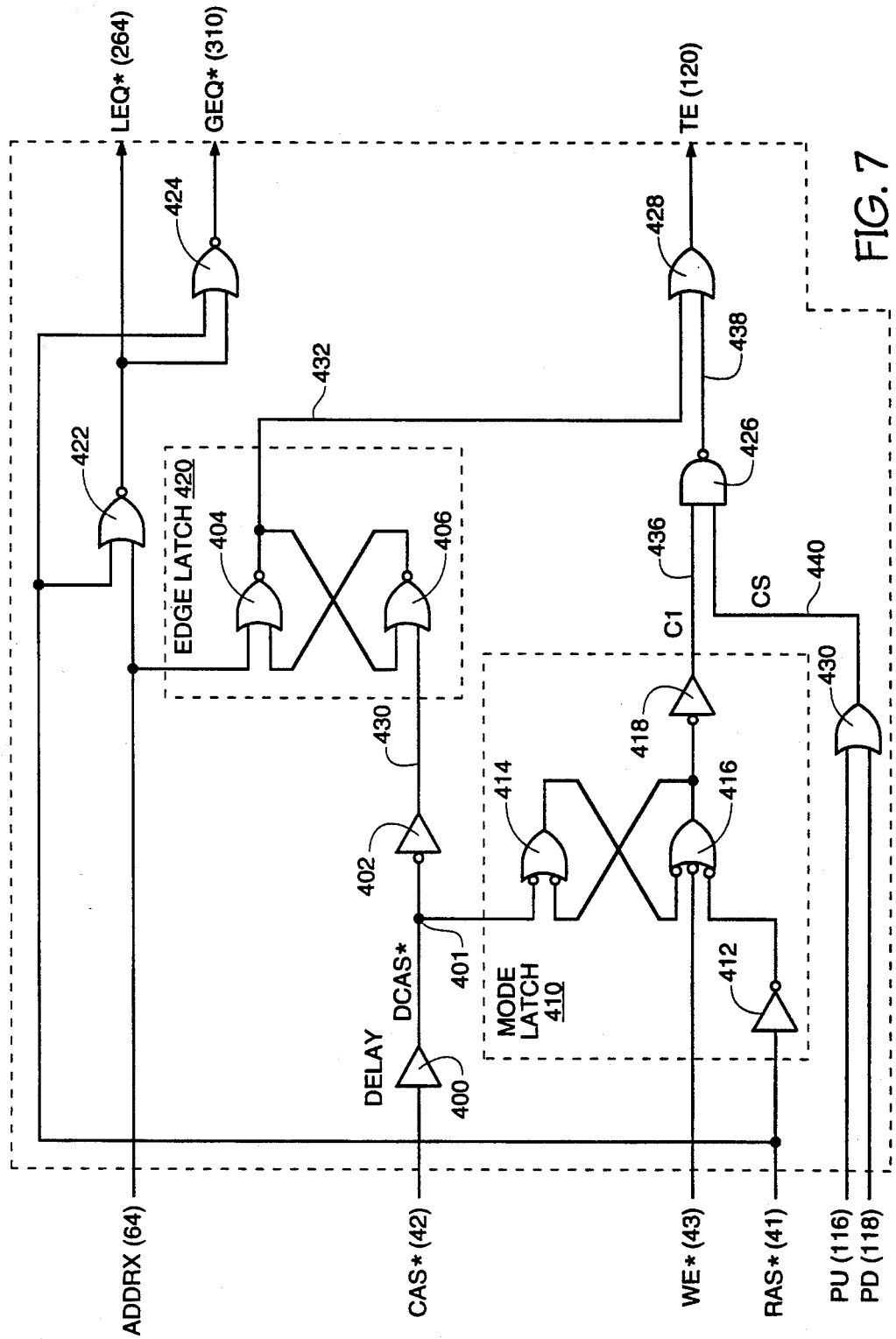
FIG. 7 is a schematic diagram of a portion of the read/write control shown in FIG. 1.

FIG. 7 is a schematic diagram of a portion of read/write control 12 shown in FIG. 1. The circuitry shown implements the timing relationships for similarly named signals shown in FIG. 6. The circuit shown in FIG. 7 produces equilibration signals 264 and 310 and transparent latch enable (TE) signal 120 as follows.

Equilibration signals 264 and 310 are held active low by gates 422 and 424, respectively, while RAS* is high. When RAS* is low, pulses on signal ADDRX are propagated through gate 422 and later through gate 424 in inverted form. The delay interposed by gates 422 and 424 is designed to accomplish rapid and reliable equilibration.

Signal TE remains high throughout the first read cycle due to the effect of intermediate signals C1 and CS. Mode latch 410 produces signal 436 (C1) as shown on FIG. 6. The initial state of mode latch 410 is determined by signals at the end of the previous operation. Thus, for example, when WE* and CAS* are high, the rising edge of RAS* through gate 412 (signifying the end of a read operation) causes C1 to fall or remain low. Now at the beginning of a read operation, when WE* is high, RAS* is low, and CAS* falls, mode latch 410 flips to the opposite state, raising C1. Signal CS indicates that global IO lines 128 and 130 have separated. Signals PU and PD are inactive when low. When one is active, global IO signals 128 and 130 (GIO1 and GIO2) have separated and gate 430 responds raising signal 440 (CS). When C1 is low or CS is low (for example, during the first read cycle shown from time 370 to 380 on FIG. 6), gate 426 drives line 438 high. Thus, line 438 is high from the rising edge of RAS* (as a consequence of equilibration) until CS goes high after the first separation of global IO lines.

After the first read cycle, signal TE responds to ADDRX and CAS*. When CAS* is high, edge latch 420 produces a logic low on line 432 in response to the ADDRX pulse input to gate 404. The logic low on line 432 has no effect on signal TE while line 438 is high, i.e. during the first read cycle. When CAS* falls and remains low, and ADDRX is no longer high, edge latch 420 raises line 432 to a logic high.

The logic low signal on line 432 propagates through gate 428 to produce a logic low on TE during all read cycles after the first cycle. The delay between the rising edge of ADDRX and the falling edge of TE, as well as the shape of the TE pulse, are adjusted by adding delay, adjusting device switching threshold, adding pulse shaping circuits, or a combination of these and similar techniques known to one skilled in the art. Delay and pulse shaping accommodate various address change detection methods and equilibration methods. The falling edge of TE must precede change on global IO signals GIO1 and GIO2 caused by equilibration so that the stored content of the transparent latch reliably represents data accurately read from memory.

For a memory device of the present invention employing DC sense amplifier 270 shown in FIG. 5, the data path, timing, and control functions of data out buffer 100 have been described. We now turn to an embodiment of the present invention characterized by novel control of the driver disable circuit.

Figure 8:
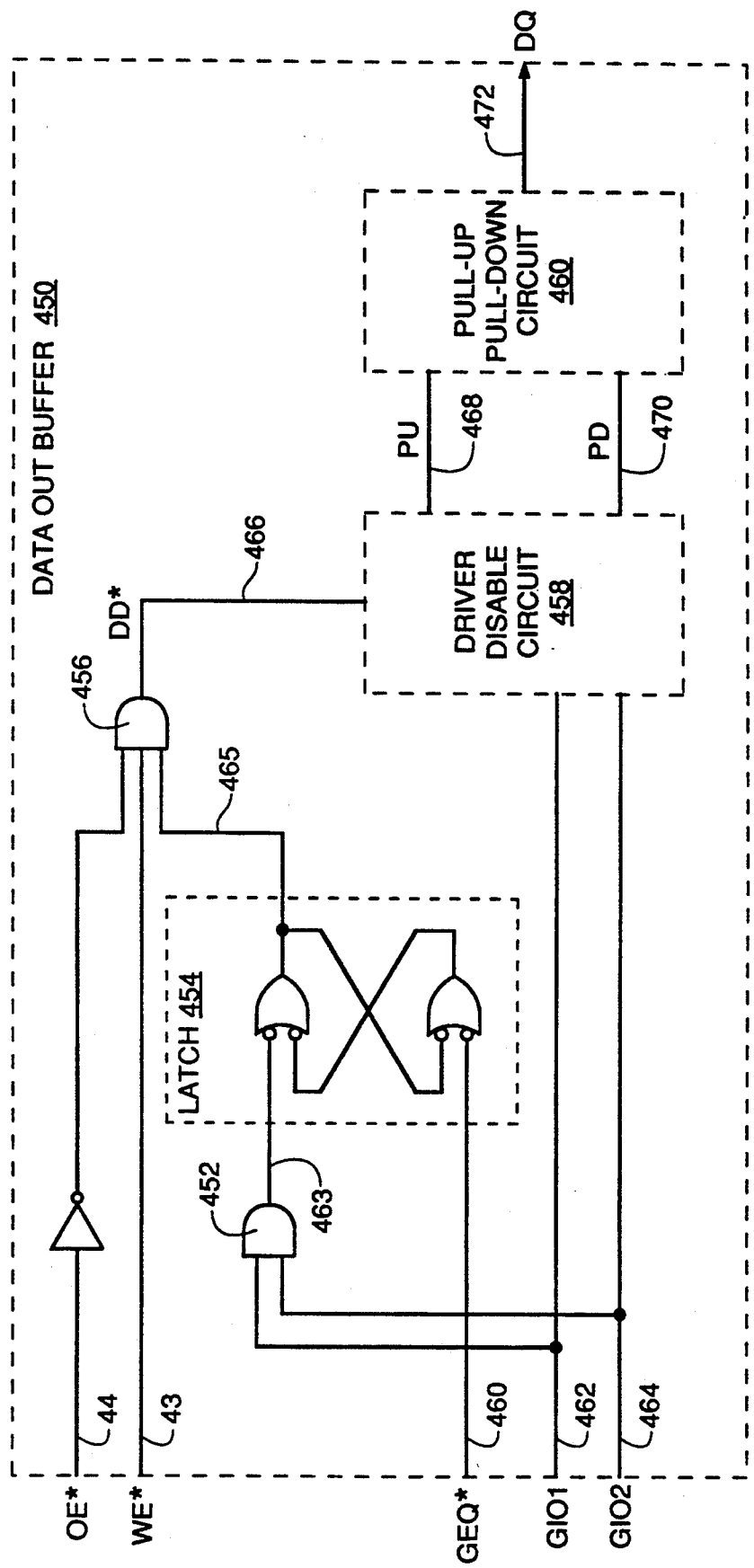
FIG. 8 is a functional block diagram of an alternate data out buffer of the memory device shown in FIG. 1.

FIG. 8 is a functional block diagram of an alternate data out buffer of the memory device shown in FIG. 1. To simplify the description of this embodiment, data out buffer 450 includes driver disable circuit 458 and pull-up pull-down circuit 460 that are identical to circuits 112 and 114, respectively, shown on FIG. 3. Thus, in the manner already discussed for circuits 112 and 114, circuit 458 responds to a driver disable (DD*) signal on line 466 by driving pull-up signal (PU) on line 468 low and by driving pull-down signal (PD) on line 470 low. A low level on signals PU and PD causes pull-up pull-down circuit 460 to place a high impedance on DQ line 472.

Signal DD* on line 466 is active low in response to signals shown on FIG. 1. Particularly, signal DD* is high, enabling signals GIO1 and GIO2 to affect signals PU and PD when output enable (OE*) signal 44 is low, write enable (WE*) signal 43 high for a read operation, and latch 454 output signal line 465 is high. To understand the operation of latch 454, consider a read operation.

During a read operation, global IO signals GIO1 and GIO2 on lines 462 and 464 (corresponding to signals 74 shown in FIG. 1) are equilibrated when signal GEQ* on line 460 is active low. After equilibration, signals GIO1 and GIO2 are both high. Latch 454 responds to the low level of signal GEQ* by driving line 465 until the global IO lines separate as indicated by the output of gate 452 on line 463. When data read from an addressed memory cell is available on global IO lines 462 and 464, the GIO1 and GIO2 signals separate. Line 463 is high as a consequence of equilibration and goes low as soon as data read from a memory cell is available on global IO lines GIO1 and GIO2. The low signal on line 465 from the time equilibration has begun to the time valid data has been read from memory prevents spurious signals from being driven onto DQ line 472.

The present invention as described above eliminates spurious signals from being driven onto the data output of a memory device. In an alternate embodiment, to be discussed below, elimination of spurious signals can be accomplished with circuitry having lower power consumption.

FIG. 9 is a schematic diagram of helper flip flop 500 included in an alternate embodiment of sense amplifiers 22 shown in FIG. 1. Helper flip flop 500 is used in place of DC sense amplifier 270 shown in FIG. 5. DC sense amplifier 270, in some applications will operate at increased power dissipation compared to helper flip flop 500.

Outputs of helper flip flop 500 are coupled to global IO lines 128 and 130 shown on FIG. 3 or, alternatively, lines 462 and 464 shown on FIG. 8. FET 510 equilibrates lines 520 and 522. Thus, at the initiation of a read operation, GIO1 and GIO2 have matching signal levels. IO signals 262 and 266 representing data read from an addressed memory cell (shown also on FIG. 4) are gated through FETs 502 and 504 respectively at a time determined by a fixed delay from the falling edge of RAS*. Global IO signals GIO1 and GIO2 on lines 520 and 522 separate as soon as cross-coupled FETs 506 and 508 attain a stable state matching the state of IO lines 262 and 266.

As described above, helper flip flop 500 depends for operation on delay circuitry driven from RAS*. The access time of a memory device employing helper flip flop 500 depends on a predetermined worst case calculation of when data on IO lines 262 and 266 is valid from any addressed cell. In contrast, in a memory device employing DC sense amplifier 270, the access time depends on a measurable condition of validity signified directly by IO lines 262 and 266 for the particular cell addressed to be read.

Another embodiment of the present invention is a simplification of the circuit shown in FIG. 8. In the simplified embodiment, latch 454 is eliminated, line 463 is connected through an inverter to line 465, and signal GEQ* on line 460 is no longer required. The simplified embodiment may be desirable in some applications where the benefit of reduced circuitry outweighs the consequence that signal DD* on line 466 disables driver circuit 458 a slightly longer delay after global equilibration than in the circuit shown in FIG. 8.

There are several alternate embodiments of the present invention. Because the invention includes memory devices having a read operation, the invention can be embodied in both read only and read/write memory devices. As shown and described, the present invention applies equally to memory devices having latched data output for extended data output operation and to memory devices that do not employ such latching circuits. The present invention applies to all circuits, collectively called memory devices, include latches, flip-flops, registers, charge coupled devices, and circuits that employ such memory devices.

Modifications to data out buffers 100 and 450 implement additional alternate embodiments of the present invention. The person having ordinary skill in the art would recognize that the present invention can easily be practiced in a memory device having three-state or open-collector operation. Data out buffer 100 is an implementation for three-state operation. With reference to FIG. 3, an alternative implementation, not shown, for open-collector operation would result from deleting gate 154 from driver disable circuit 112 and deleting gate 160 and FET 162 from pull-up pull-down circuit 114. With reference to FIG. 8, Similar modifications to driver disable circuit 458 and pull-up pull-down circuit 460 would implement data out buffer 450 for open-collector operation.

The foregoing description discusses preferred embodiments of the present invention, which may be changed or modified without departing from the scope of the present invention. For example, P-channel FETS discussed above may be replaced with N-channel FETS (and vice versa) in some applications with appropriate polarity changes in controlling signals as required. Moreover, the P-channel and N-channel FETS discussed above generally represent active devices which may be replaced with bipolar or other technology active devices. Still further, those skilled in the art will understand that the logical elements described above may be formed using a wide variety of logical gates employing any polarity of input or output signals and that the logical values described above may be implemented using different voltage polarities. As an example, an AND element may be formed using an AND gate or a NAND gate when all input signals exhibit a positive logic convention or it may be formed using an OR gate or a NOR gate when all input signals exhibit a negative logic convention. These and other changes and modifications are intended to be included within the scope of the present invention.

While for the sake of clarity and ease of description, several specific embodiments of the invention have been described, the scope of the invention is intended to be measured by the claims as set forth below. Other embodiments of the invention will be apparent in light of the disclosure to one of ordinary skill in the arts to which the invention applies.

The words and phrases used in the claims are intended to be broadly construed. A "system" refers generally to electrical apparatus and includes but is not limited to a packaged integrated circuit, an unpackaged integrated circuit, a combination of packaged or unpackaged integrated circuits or both, a microprocessor, a microcontroller, a memory, a register, a flipflop, a charge-coupled device, combinations thereof, and equivalents. A "signal" refers to mechanical and/or electromagnetic energy conveying information. When elements are coupled, a signal can be conveyed in any manner feasible in light of the nature of the coupling. For example, if several electrical conductors couple two elements, then the relevant signal comprises the energy on one, some, or all conductors at a given time or time period. When a physical property of a signal has a quantitative measure and the property is used by design to control or communicate information, then the signal is said to be characterized by having a "value."

What is claimed is;

1. A system for driving stored data onto a bidirectional bus, the system comprising:
  a. initiating means for initiating recall of the data, for providing a first control signal when recall has been initiated, and for providing a second control signal;
  b. a memory, coupled to the initiating means and responsive to the first control signal and the second control signal, for retaining the data, and for providing a first memory signal when recall has been initiated, and for providing a second memory signal when the data has been recalled, the second memory signal conveying recalled data;
  c. output means, coupled to the initiating means and responsive to the first control signal and the second control signal and coupled to the memory and responsive to the first memory signal and the second memory signal, for selectively coupling the output means to the bidirectional bus and for driving an output signal onto the bidirectional bus, the operation of the output means characterized by:
    (1) a first mode wherein the output means is decoupled by from the bidirectional bus;
    (2) a second mode wherein the output means is storing recalled data conveyed by the second memory signal, is coupled to the bidirectional bus, and is driving the bidirectional bus in response to the second memory signal; or
    (3) a third mode wherein the output means is coupled to the bidirectional bus, and is driving the bidirectional bus in response to the stored recalled data; and
  d. in operation, the output means:
    (1) ceases operating according to the first mode and begins operating according to the second mode when the second memory signal is provided;
    (2) ceases operating according to the second mode and begins operating according to the third mode when the first control signal is provided; and
    (3) ceases operating according to the third mode and begins operating according to the first mode when the second control signal is provided, unless the second memory signal has not been provided since the first control signal has been provided, in which case the output means ceases operating according to the third mode and begins operating according to the second mode.

2. The system of claim 1 wherein:
  a. the first control signal further comprises an address signal and an address change signal, the address signal conveying at a first time a first call address and conveying at a second time a second cell address;
  b. the second control signal further comprises an address strobe, the address strobe having a transition after the address change signal; and
  c. the initiating means comprises addressing means, coupled to the memory, for comparing the second cell address to the first cell address, and for providing the address change signal at the second time.

3. The system of claim 2 wherein the memory comprises:
  a. selecting means, coupled to the initiating means and responsive to the address signal and the address strobe, for providing a cell select signal;
  b. a circuit coupled to the selecting means and responsive to the cell select signal, the circuit, comprising a plurality of addressable cells, for providing a cell content signal conveying data recalled from a cell identified by the cell select signal; and
  c. recalling means, coupled to the circuit and responsive to the cell content signal and coupled to the means for addressing and responsive to the address change signal, for providing the first memory signal after the address change signal has been provided, and for providing the second memory signal after the cell content signal has been provided.

4. The system of claim 3 wherein the output means comprises:
  a. control means, coupled to the initiating means and responsive to the first control signal and the second control signal and coupled to the recalling means and responsive to the second memory signal, for controlling a transparent latch, for providing a transparent disable signal at a time after the second memory signal has been provided when the first control signal has been provided, and for providing a transparent enable signal at a time after the transparent disable signal has been provided when the second control signal has been provided;
  b. a transparent latch, coupled to the control means and responsive to the transparent disable signal and the transparent enable signal and coupled to the recalling means and responsive to the first memory signal and the second memory signal, for storing the recalled data conveyed by the second memory signal sampled while the transparent enable signal is provided and until the transparent disable signal is provided, and for providing a latch output signal, the latch output signal conveying, after receiving the transparent enable signal, the first memory signal and the second memory signal, the latch output signal conveying, after receiving the transparent disable signal, the stored recalled data; and c. drive means, coupled to the transparent latch and responsive to the latch output signal, for coupling the output means to the bidirectional bus and driving the output signal onto the bidirectional bus, the drive means being decoupled from the bidirectional bus after receiving the latch output signal conveying the first memory signal, the drive means being coupled to the bidirectional bus and driving the output signal onto the bidirectional bus responsive to recalled data after receiving the latch output signal conveying the second memory signal.

5. The system of claim 4 wherein the control means comprises:

a. delaying means, coupled to the initiating means and responsive to the address strobe, for providing a delayed address strobe with a delayed transition; and b. a control latch, coupled to the initiating means and responsive to the address change signal and coupled to the delaying means and responsive to the delayed address strobe, for providing the transparent disable signal after the address change signal, and for providing the transparent enable signal after the delayed transition of the delayed address strobe.

6. The system of claim 5 wherein the control means further comprises maintaining means, coupled to the control latch and coupled to the delaying means responsive to the delayed address strobe, for inhibiting the provision of the transparent disable signal by the control latch from a time after the address change signal until after the next occurring delayed address strobe.

7. A method for driving stored data onto a bidirectional bus, the method comprising the steps of:

equilibrating a first data signal and a second data signal each provided by a memory, the first data signal and the second data signal respectively characterized by a first and a second equilibrated value;

presenting a first address to the memory, the memory containing stored data;

recalling first data stored in the memory at the first address, wherein when the first data is recalled, the first data signal and the second data signal are no longer both characterized by the respective equilibrated value, the first and second data signals thereby conveying the first data;

passing the first and second data signals through a transparent latch wherein the transparent latch provides a first maintainable data signal corresponding to the first data signal and a second maintainable data signal corresponding to the second data signal;

when the data is recalled, coupling the memory to the bidirectional bus and driving the bidirectional bus in response to the first and second maintainable data signals; and maintaining, by operation of the transparent latch, the first and second maintainable data signals without further response to the first and second data signals.

8. The method of claim 7 further comprising the steps of:

providing to the memory a second address and an address strobe;

beginning, when the second address is provided, the step of maintaining and the step of equilibrating; and beginning, after the address strobe is provided, the step of coupling.

9. A system for driving stored data onto a bidirectional bus, the system comprising:

a. initiating means recall of the data, and for providing a control signal when recall has been initiated;

b. a memory, coupled to the means for initiating and responsive to the control signal, for retaining the data, for providing a first signal when recall has been initiated, and for providing a second signal when the data has been recalled, the second signal conveying recalled data; and c. output means, coupled to the initiating means and coupled to the memory, for disabling driving the bidirectional bus, and for enabling driving the bidirectional bus, wherein disabling is in response to the control signal, and enabling is in response to the second signal.

10. The system of claim 9 wherein:

a. the control signal comprises an address signal and an address change signal, the address signal conveying at a first time a first cell address and conveying at a second time a second cell address; and b. the initiating means comprises addressing means, coupled to the memory, for comparing the second cell address to the first cell address, and for providing the address change signal at the second time.

11. The system of claim 10 wherein the memory comprises:

a. selecting means, coupled to the initiating means and responsive to the address signal, for providing a cell select signal;

b. a circuit coupled to the selecting means and responsive to the cell select signal, the circuit, comprising a plurality of addressable cells, for providing a cell content signal conveying data recalled from a cell identified by the cell select signal; and c. recalling means, coupled to the circuit and responsive to the cell content signal and coupled to the addressing means and responsive to the address change signal, for providing the first signal after the address change signal has been provided, and for providing the second signal after the cell content signal has been provided.

12. The system of claim 11 wherein the recalling means comprises:

a. a sense amplifier, coupled to the circuit and responsive to the cell content signal, for providing an amplified signal characterized by a first sense value when the cell content signal conveys recalled data being a zero, and a second sense value when the cell content signal conveys recalled data being a one; and b. equilibrating means, coupled to the initiating means and responsive to the address change signal and coupled to the sense amplifier and responsive to the amplified signal and coupled to the output means, for equilibrating the cell content signal and for providing a composite signal, wherein the composite signal is characterized by:

(1) a first value when the cell content signal is equilibrated;

(2) a second value after the amplified signal having the first sense value has been provided; and (3) a third value after the amplified signal having the second sense value has been provided.

13. The system of claim 12 wherein the output means comprises:
 a. controlling means, coupled to the initiating means and responsive to the address change signal and coupled to the equilibrating means and responsive to the composite signal, for providing a driver disable signal after the address change signal has been provided, for providing a driver enable signal after the composite signal having the second value has been provided, and for providing a driver enable signal after the composite signal having the third value has been provided; and
 b. driving means, coupled to the equilibrating means and responsive to the composite signal and coupled to the controlling means and responsive to the driver disable signal and the driver enable signal, for providing an output signal to be driven onto the bidirectional bus, wherein the output signal is characterized by:
   (1) a first output value after the driver disable signal has been provided;
   (2) the first output value after the driver enable signal and the composite signal having the first value have been provided;
   (3) a second value after the driver enable signal and the composite signal having the second value have been provided; and
   (4) a third value after the driver enable signal and the composite signal having the third value have been provided.

14. The system of claim 13 wherein the controlling means comprises:
 a. detecting means, coupled to the equilibrating means and responsive to the composite signal, for providing a first set signal when the composite signal having the first value is provided; and
 b. a latch, coupled to the initiating means and responsive to the address change signal and coupled to the detecting means and responsive to the first set signal, for providing the driver disable signal after the address change signal has been provided, and for providing the driver enable signal after the first set signal has been provided.

15. A system for driving stored data onto a bidirectional bus, the system comprising:
 a. initiating means for initiating recall of the data, and for providing a control signal when recall has been initiated;
 b. a memory, coupled to the initiating means and responsive to the control signal, for retaining the data, for providing a first signal when recall has been initiated, and for providing a second signal when the data has been recalled, the second signal conveying recalled data; and
 c. output means, coupled to the memory, for driving an output signal onto the bidirectional bus wherein driving is disabled in response to the first signal and driving is enabled in response to the second signal.

16. The system of claim 15 wherein:
 a. the control signal further comprises an address signal and an address change signal, the address signal conveying at a first time a first cell address and conveying at a second time a second cell address; and
 b. the initiating means comprises addressing means, coupled to the memory, for comparing the second cell address to the first cell address, and for providing the address change signal at the second time.

17. The system of claim 16 wherein the memory comprises:
 a. selecting means, coupled to the initiating means and responsive to the address signal, for providing a cell select signal;
 b. a circuit coupled to the selecting means and responsive to the cell select signal, the circuit, comprising a plurality of addressable cells, for providing a cell content signal conveying data recalled from a cell identified by the cell select signal; and
 c. recalling means, coupled to the circuit and responsive to the cell content signal and coupled to the addressing means and responsive to the address change signal, for providing the first signal after the address change signal has been provided, and for providing the second signal after the cell content signal has been provided.

18. The system of claim 17 wherein the recalling means comprises:
 a. a sense amplifier, coupled to the circuit and responsive to the cell content signal, for providing an amplified signal characterized by a first sense value when the cell content signal conveys recalled data being a zero, and a second sense value when the cell content signal conveys recalled data being a one; and
 b. equilibrating means, coupled to the initiating means and responsive to the address change signal and coupled to the sense amplifier and responsive to the amplified signal and coupled to the output means, for equilibrating the cell content signal and for providing a composite signal, wherein the composite signal is characterized by:
   (1) a first value when the cell content signal is equlibrated;
   (2) a second value after the amplified signal having the first sense value has been provided; and
   (3) a third value after the amplified signal having the second sense value has been provided.

19. The system of claim 18 wherein the output means comprises:
 a. controlling means, coupled to the equilibrating means and responsive to the composite signal, for providing a driver disable signal after the composite signal having the first value has been provided, for providing a driver enable signal after the composite signal having the second value has been provided, and for providing a driver enable signal after the composite signal having the third value has been provided; and
 b. driving means, coupled to the equilibrating means and responsive to the composite signal and coupled to the controlling means and responsive to the driver disable signal and the drive enable signal, for providing the output signal, wherein the output signal is characterized by:
   (1) a first output value after the driver disable signal has been provided;
   (2) the first output value after the driver enable signal and the composite signal having the first value have been provided;
   (3) a second value after the driver enable signal and the composite signal having the second value have been provided; and (4) a third value after the driver enable signal and the composite signal having the third value have been provided.

20. A method for driving stored data on to a bidirectional bus, the method comprising the steps of:

equilibrating a first data signal and a second data signal each provided by a memory, the first data signal and the second data signal respectively characterized by a first and a second equilibrated value;

presenting an address to the memory, the memory containing stored data;

recalling data stored in the memory at the address, wherein when the data is recalled, the first data signal and the second data signal are no longer both characterized by the respective equilibrated value, the first and second data signals thereby conveying the stored data; and when the data is recalled, coupling the memory to the bidirectional bus and driving the bidirectional bus in response to the first and second data signals.

* * * * *